(12) United States Patent
Liu et al.

(10) Patent No.: US 11,152,436 B2
(45) Date of Patent: Oct. 19, 2021

(54) DISPLAY PANEL, FABRICATION METHOD THEREOF, AND DISPLAY DEVICE

(71) Applicants:BEIJING BOE DISPLAY TECHNOLOGY CO., LTD., Beijing (CN); BOE TECHNOLOGY GROUP CO., LTD., Beijing (CN)

(72) Inventors: Shuai Liu, Beijing (CN); Yun Qiu, Beijing (CN); Hebin Zhao, Beijing (CN); Lianjie Qu, Beijing (CN); Yonglian Qi, Beijing (CN); Weiwei Tong, Beijing (CN); Guangdong Shi, Beijing (CN); Bin Yan, Beijing (CN); Tao Liu, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 412 days.

(21) Appl. No.: 16/082,049

(22) PCT Filed: Feb. 12, 2018

(86) PCT No.: PCT/CN2018/076371
§ 371 (c)(1),
(2) Date: Sep. 4, 2018

(87) PCT Pub. No.: WO2019/019614
PCT Pub. Date: Jan. 31, 2019

(65) Prior Publication Data
US 2020/0295100 A1 Sep. 17, 2020

(30) Foreign Application Priority Data
Jul. 25, 2017 (CN) .......................... 201710617292.7

(51) Int. Cl.
*H01L 27/32* (2006.01)
*H01L 51/50* (2006.01)
(Continued)

(52) U.S. Cl.
CPC ...... *H01L 27/3246* (2013.01); *H01L 27/3262* (2013.01); *H01L 27/3276* (2013.01);
(Continued)

(58) Field of Classification Search
CPC ............. H01L 27/3246; H01L 27/3262; H01L 27/3276; H01L 51/5212; H01L 51/5234
See application file for complete search history.

(56) References Cited

U.S. PATENT DOCUMENTS

2005/0285509 A1 12/2005 Funamoto et al.
2014/0117319 A1 5/2014 Wu
(Continued)

FOREIGN PATENT DOCUMENTS

CN 1662112 A 8/2005
CN 102881835 A 1/2013
(Continued)

OTHER PUBLICATIONS

First Office Action for Chinese Patent Application No. 201710617292.7 dated Jul. 1, 2019.
(Continued)

*Primary Examiner* — Anthony Ho
(74) *Attorney, Agent, or Firm* — Calfee, Halter & Griswold LLP

(57) ABSTRACT

A display panel, fabrication method thereof, and a display device. The display panel includes a substrate and a plurality of pixels disposed on the substrate; each pixel includes a pixel circuit disposed on the substrate; the display panel further includes a pixel defining layer covering the pixel circuit; a surface of the pixel defining layer facing away
(Continued)

from the pixel circuit is provided with a plurality of grooves; the plurality of grooves are in one-to-one correspondence with the plurality of pixels; each of the grooves is provided with a light emitting diode electrically connected to the pixel circuit.

14 Claims, 11 Drawing Sheets

(51) Int. Cl.
    *H01L 51/52*     (2006.01)
    *H01L 51/56*     (2006.01)

(52) U.S. Cl.
    CPC ........ *H01L 51/502* (2013.01); *H01L 51/5056* (2013.01); *H01L 51/5212* (2013.01); *H01L 51/5234* (2013.01); *H01L 51/5253* (2013.01); *H01L 51/56* (2013.01); *H01L 2227/323* (2013.01); *H01L 2251/305* (2013.01)

(56) References Cited

U.S. PATENT DOCUMENTS

| | | |
|---|---|---|
| 2014/0306200 A1 | 10/2014 | Jinta et al. |
| 2014/0353599 A1 | 12/2014 | Kang |
| 2015/0249097 A1 | 9/2015 | Qi et al. |
| 2017/0186819 A1 | 6/2017 | Yun et al. |

FOREIGN PATENT DOCUMENTS

| | | |
|---|---|---|
| CN | 103219336 A | 7/2013 |
| CN | 103311265 | 9/2013 |
| CN | 104103667 A | 10/2014 |
| CN | 104218055 A | 12/2014 |
| CN | 105140370 A | 12/2015 |
| CN | 105230125 A | 1/2016 |
| CN | 105336763 A | 2/2016 |
| CN | 106298647 A | 1/2017 |
| CN | 106444250 | 2/2017 |
| JP | 2003272872 A | 9/2003 |

OTHER PUBLICATIONS

Office action from Indian Application No. 201847033067 dated Aug. 28, 2020.

Search Report and Written Opinion for International Application No. PCT/CN2018/076371 dated May 4, 2018.

Search Report from European Application No. 18758528.6 dated Feb. 19, 2021.

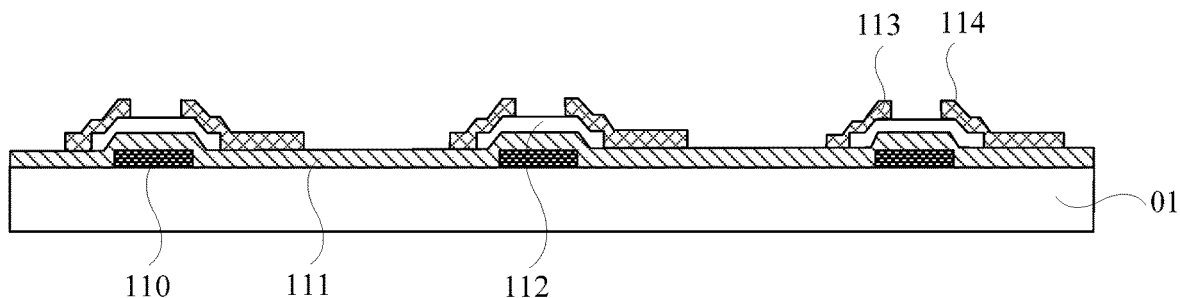

Fig. 8e

| forming a pixel defining layer covering the pixel circuit; a surface of the pixel defining layer facing away from the pixel circuit being provided with a plurality of grooves; a cofferdam is disposed around each of the grooves; the plurality of grooves are in one-to-one correspondence with the plurality of pixels | ─S101 |

↓

| forming a light emitting diode electrically connected to the pixel circuit in the groove | ─S102 |

Fig. 9

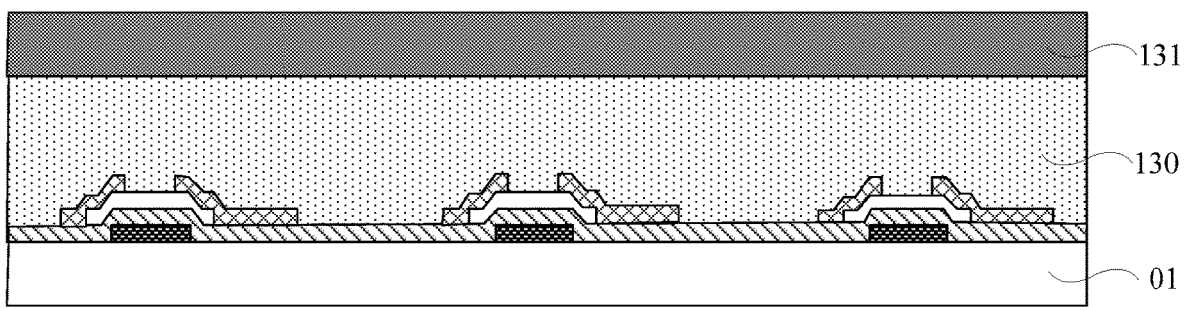

Fig. 10a

DISPLAY PANEL, FABRICATION METHOD THEREOF, AND DISPLAY DEVICE

RELATED APPLICATIONS

The present application is the U.S. national phase entry of the international application PCT/CN2018/076371, with an international filing date of Feb. 12, 2018, which claims the benefit of Chinese Patent Application No. 201710617292.7, filed on Jul. 25, 2017, the entire disclosure of which is incorporated herein by reference.

TECHNICAL FIELD

The present disclosure relates to the field of display technology, in particular to a display panel, a fabrication method thereof, and a display device.

BACKGROUND

With the development of display technology, some new display panels, such as transparent display panels, have emerged according to the requirements of users. While watching the display image on the transparent display panel, the user can also see the scene behind the display panel through the display panel. The transparent display panel can be generally applied to glass of a building or a car, a display window of a shopping mall, and the like.

SUMMARY

An embodiment of the present disclosure provides a display panel. The display panel includes a substrate and a plurality of pixels disposed on the substrate; each pixel includes a pixel circuit disposed on the substrate; the display panel further includes a pixel defining layer covering the pixel circuit; a surface of the pixel defining layer facing away from the pixel circuit is provided with a plurality of grooves; the plurality of grooves are in one-to-one correspondence with the plurality of pixels; each of the grooves is provided with a light emitting diode electrically connected to the pixel circuit.

In certain exemplary embodiments, an orthographic projection of each groove on the substrate overlaps with a light emitting area in a corresponding pixel.

In certain exemplary embodiments, the pixel defining layer is composed of a passivation layer covering the pixel circuit; a depth of the groove is less than a thickness of the passivation layer.

In certain exemplary embodiments, the pixel defining layer is composed of a passivation layer covering the pixel circuit and a photoresist layer disposed on a surface of the passivation layer facing away from the pixel circuit; a depth of the groove is less than or equal to a thickness of the photoresist layer.

In certain exemplary embodiments, the pixel circuit includes a thin film transistor, the light emitting diode is electrically connected to a drain of the thin film transistor.

In certain exemplary embodiments, a first via hole is disposed at a position of a bottom of the groove corresponding to a drain of the thin film transistor, and a first electrode of the light emitting diode is electrically connected to the drain of the thin film transistor through the first via hole.

In certain exemplary embodiments, a plurality of walls crossing the groove are disposed separately in the groove; the walls are in the same layer as the pixel defining layer, and the walls are of the same material as the pixel defining layer.

In certain exemplary embodiments, any two of the walls extend in the same direction, and a distance between two directly adjacent walls is fixed.

In certain exemplary embodiments, the plurality of walls include first sub-walls and second sub-walls respectively extend horizontally and vertically; the first sub-walls and the second sub-walls intersect to define a plurality of enclosed areas arranged in a matrix; two directly adjacent enclosed areas are equal in area.

In certain exemplary embodiments, the light emitting diode includes: a hole transport layer, a light emitting layer, an electron transport layer and a second electrode which are sequentially located on a side of the first electrode facing away from the pixel circuit; the first electrode is made of a transparent conductive material, the second electrode is made of a metal material; alternatively, the first electrode is made of a metal material, and the second electrode is made of a transparent conductive material.

In certain exemplary embodiments, the light emitting diode is a quantum dot light emitting diode, and a material of the light emitting layer includes at least any one of CdSe, CdS, CdTe, ZnSe, ZnTe, ZnS, HgTe, InAs, InP, and GaAs.

In certain exemplary embodiments, a material constituting the active layer of the thin film transistor includes at least one of an oxide semiconductor material and a low temperature polysilicon.

According to another exemplary embodiment of the present disclosure, a display device including the display panel according to any of the above embodiments is provided.

According to yet another exemplary embodiment of the present disclosure, a method of fabricating a display panel is provided. The method includes: forming a plurality of pixels on a substrate by a composition process, each pixel including a pixel circuit disposed on the substrate; forming a pixel defining layer covering the pixel circuit; a surface of the pixel defining layer facing away from the pixel circuit being provided with a plurality of grooves; the plurality of grooves being in one-to-one correspondence with the plurality of pixels; and forming a light emitting diode electrically connected to the pixel circuit in the groove.

In certain exemplary embodiments, the step of forming the pixel defining layer includes: sequentially forming a passivation layer and a photoresist layer on the substrate on which the pixel circuit is formed; forming the grooves on the passivation layer by a composition process using a gray-tone mask; forming a first via hole at the bottom of the groove. The step of forming the light emitting diode includes forming a first electrode in the groove, the first electrode being electrically connected to the pixel circuit through the first via hole.

In certain exemplary embodiments, the step of forming the pixel defining layer includes: sequentially forming a passivation layer and a photoresist layer on the substrate on which the pixel circuit is formed; forming the grooves on the photoresist layer by a composition process using a gray-tone mask; forming a first via hole penetrating the photoresist layer and the passivation layer at the bottom of the groove. The step of forming the light emitting diode includes forming a first electrode in the groove, the first electrode being electrically connected to the pixel circuit through the first via hole.

In certain exemplary embodiments, the step of forming the pixel defining layer includes: forming a passivation layer on the substrate on which the pixel circuit is formed, and forming a first via hole on the passivation layer by a composition process; forming a transparent conductive layer on the substrate, and forming the first electrode by a composition process; the first electrode is electrically connected to the pixel circuit through the first via hole; forming an insulating material layer on the substrate, and forming the grooves on the insulating material layer by a composition process.

In certain exemplary embodiments, the step of forming the light emitting diode further includes: forming a hole transport layer at a position corresponding to the groove by a composition process on a side of the first electrode facing away from the substrate; forming a light emitting layer at a position corresponding to the groove by an inkjet printing process or an evaporation process on the substrate on which the hole transport layer is formed; forming an electron transport layer at a position corresponding to the groove by a composition process on the substrate on which the light emitting layer is formed; and forming a second electrode of the light emitting diode on the substrate on which the electron transport layer is formed.

BRIEF DESCRIPTION OF THE DRAWINGS

In order to more clearly illustrate the technical solutions in embodiments of the disclosure or in the prior art, the appended drawings needed to be used in the description of the embodiments or the prior art will be introduced briefly in the following. Obviously, the drawings in the following description are only some embodiments of the disclosure, and for those of ordinary skills in the art, other drawings can be obtained according to these drawings under the premise of not paying out creative work.

FIG. 3a is a structural schematic diagram of the light emitting diode in

FIG. 1;

FIGS. 8a, 8b, 8c, 8d, and 8e are schematic diagrams of a process of forming a thin film transistor on a substrate;

FIG. 9 is a flow chart of a method for fabricating a display panel according to an embodiment of the present disclosure;

FIGS. 10a, 10b, 10c, 10d, and 10e are schematic diagrams of an implementation of step S101 in FIG. 9;

DETAILED DESCRIPTION OF THE DISCLOSURE

In the following, the technical solutions in the embodiments of the disclosure will be described clearly and completely in connection with the drawings in the embodiments of the disclosure. Obviously, the described embodiments are only part of the embodiments of the disclosure, and not all of the embodiments. Based on the embodiments in the disclosure, all other embodiments obtained by those of ordinary skill in the art under the premise of not paying out creative work pertain to the protection scope of the disclosure.

Figure 2:
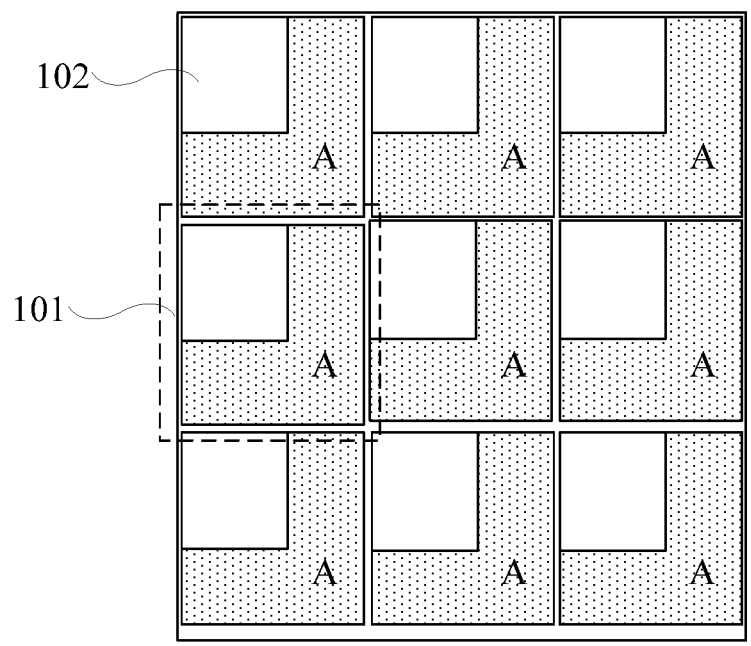
FIG. 2 is a top view of the display panel in FIG. 1.

An embodiment of the present disclosure provides a display panel. As shown in FIG. 2, the display panel includes a substrate 01 and a plurality of pixels 101 disposed on the substrate 01; each pixel 101 includes a pixel circuit 102 on the substrate 01, the display panel further includes a pixel defining layer 20 covering the pixel circuit 102; a surface of the pixel defining layer 20 facing away from the pixel circuit 102 is provided with a plurality of grooves 201; the plurality of grooves 201 are in one-to-one correspondence with the plurality of pixels 101; each of the grooves 201 is provided with a light emitting diode 30 electrically connected to the pixel circuit 102. The light emitting diode may be a quantum dot light emitting diode (QLED).

Figure 1:
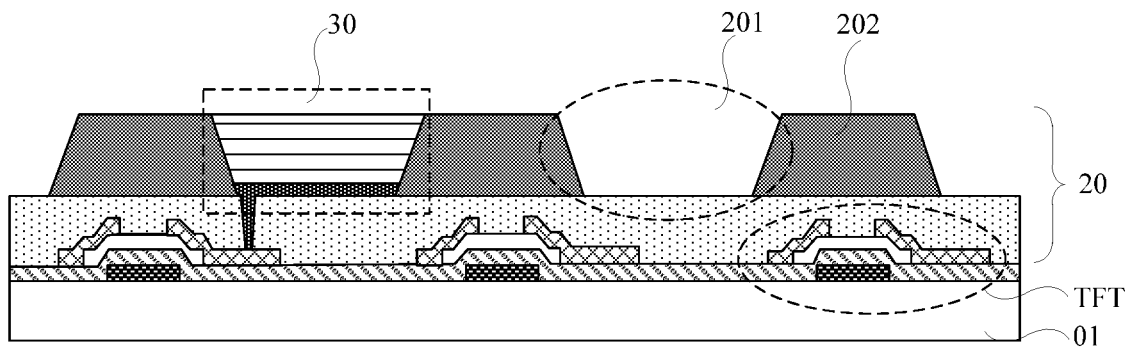
FIG. 1 is a structural schematic diagram of a display panel according to an embodiment of the present disclosure.

Based on this, as shown in FIG. 1 and FIG. 2, since the plurality of grooves 201 are in one-to-one correspondence with the plurality of pixels 101, and the plurality of pixels 101 are connected to each other, a cofferdam 202 corresponding to the pixel circuit 102 is formed. The orthographic projection of the groove 201 on the substrate 01 may overlaps with the light emitting area A in the corresponding pixel 101. The light emitting area A is an area in the pixel 101 other than an area where the pixel circuit 102 is disposed.

Figure 3A:
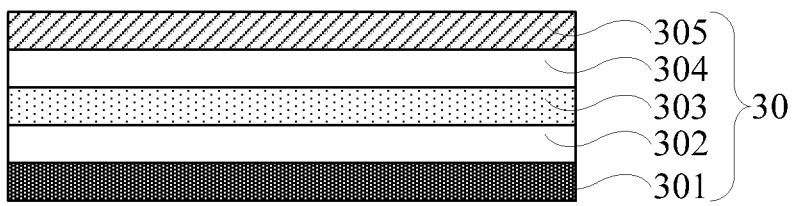

Specifically, the light emitting diode 30 can include a structure as shown in FIG. 3a. The light emitting diode 30 can include a first electrode 301, a hole transport layer 302 (HTL), a light emitting layer 303, an electron transport layer 304, and a second electrode 305 which are sequentially located on a side of the thin film transistor (TFT) facing away from the substrate 01. In certain exemplary embodiments, the light emitting diode 30 can further include a hole injection layer between the first electrode 301 and the hole transport layer 302, and an electron injection layer between the electron transport layer 304 and the second electrode 305. Typically, the first electrode 301 may be an anode of the light emitting diode 30, and the second electrode 305 may be a cathode of the light emitting diode 30.

Based on this, the light emitting diode 30 may be a top-emitting type or a bottom-emitting type. When the light emitting diode 30 is of a top-emitting type, a material constituting the second electrode 305 may be a transparent conductive material, such as indium tin oxide (ITO) or indium zinc oxide (IZO); a material constituting the first electrode 301 may be a metal material. When the light emitting diode 30 is of a bottom-emitting type, the material constituting the first electrode 301 may be the above transparent conductive material; and the material constituting the second electrode 305 may be a metal material.

Further, the light emitting diode 30 may be a quantum dot light emitting diode. The light emitting layer 303 may include a II-VI or a III-V nano-semiconductor compound, the nano-semiconductor compound includes at least one of CdSe, CdS, CdTe, ZnSe, ZnTe, ZnS, HgTe, InAs, InP, and GaAs, thereby forming a quantum dot light emitting layer.

Based on this, the light emitting layer 303 may be a single-layer film layer or a multi-layer film. When the light emitting layer 303 is a multi-layer film, materials constituting each film layer may include at least any one of the above-mentioned CdSe, CdS, CdTe, ZnSe, ZnTe, ZnS, HgTe, InAs, InP, and GaAs.

The preparing method of the above nano-semiconductor compound includes an organic fusion method or an aqueous phase synthesis method.

Specifically, in the organic fusion method, the organometallic precursor solution is injected into a high temperature ligand solution, the precursor is rapidly pyrolyzed and nucleated under high temperature (200-600° C.) conditions, and then the crystal nucleus slowly grows into nanocrystals. The method is relatively expensive, and the metal compound precursor used has relatively large toxicity and self-ignitability, thus requires to be stored under high pressure, and explosively releases a large amount of gas and heat upon injection.

In the aqueous phase synthesis method, various mercapto compounds, for example small molecules such as mercapto acids, mercapto alcohols, mercapto amines and mercapto amino acids are used as stabilizers, and the fluorescent nanoparticles are crystallized in an aqueous solution at 100° C. Compared with the organic synthesis method, aqueous phase synthesis has the advantages of simple operation, low cost and low toxicity.

In addition, the preparing method of the nano-semiconductor compound can further include a high-temperature hydrothermal method and a microwave irradiation method, etc., which will not be described in detail herein.

Figure 3B:
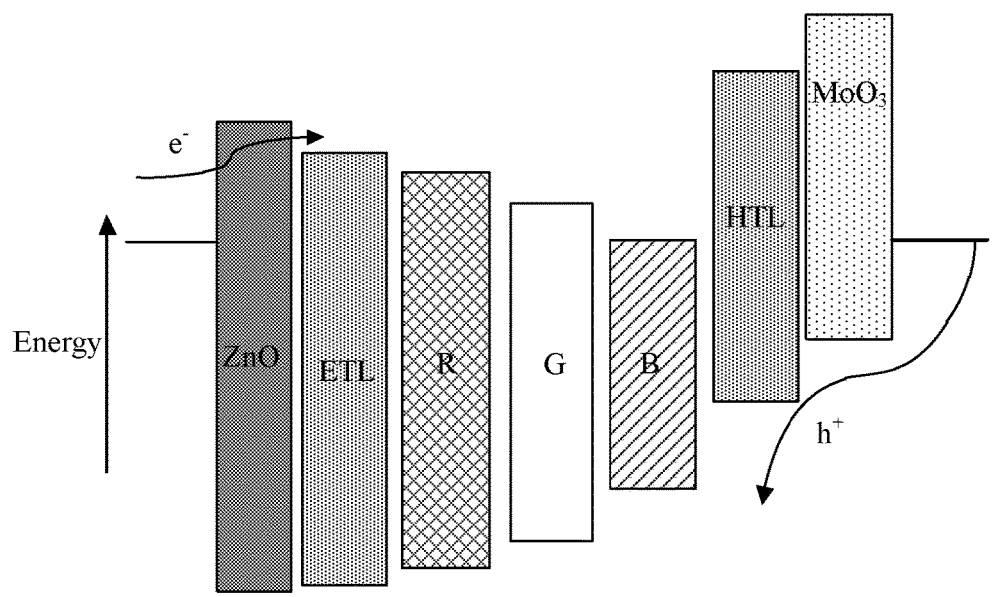
FIG. 3b is a schematic diagram of the energy levels of the light emitting diode in FIG. 1.

Based on this, in an example, the material constituting the first electrode of the light emitting diode 30 is molybdenum trioxide ($MoO_3$), and the material constituting the second electrode is zinc oxide (ZnO), the light emitting process of the light emitting diode 30 is described below. Specifically, as shown in FIG. 3b, electrons ($e^-$) and holes ($h^+$) are respectively injected from the second electrode and the first electrode, driven by an external voltage. The injected electrons and holes migrate from the electron transport layer (ETL) and the hole transport layer (HTL) to the light emitting layer (R, G, B), respectively. Electrons and holes are directly injected into the conduction band and the valence band of the light emitting layer to form excitons, which are then combined to emit photons. The band gap energy of the light emitting layer varies with the R, G, and B colors, and the band gap energy becomes greater in the order of R, G, and B. Further, when holes are injected from the hole injection layer to the light emitting layer, there is a hole energy barrier from about 0.7 eV to 2 eV although there is a difference between the colors.

Based on this, the pixel circuit 102 is configured to drive the LED 30 to emit light. The pixel circuit 102 can include at least two thin film transistors and one capacitor. The at least two thin film transistors include a driving transistor having a driving function, and some switching transistors realizing a switching function. A part of the switching transistors can write the data voltage Vdata on the data line to the driving transistor. In addition, when the pixel circuit 102 further has a threshold voltage compensation function, a part of the switching transistors can compensate the threshold voltage Vth of the driving transistor to reduce the luminance difference between the respective pixels 101. Alternatively, when the pixel circuit 102 further has a reset function, a part of the switching transistors can perform voltage reset on the gate of the driving transistor and the light emitting diode 30. The present disclosure does not limit the structure of the pixel circuit 102. In this case, at least one of the thin film transistors in the pixel circuit 102 is electrically connected to the light emitting diode 30. For example, the thin film transistor may be the above-mentioned driving transistor.

Based on this, in order to improve the mobility and the conduction performance of the thin film transistor, In certain exemplary embodiments, the material constituting the active layer of the thin film transistor may be low temperature poly-silicon (LTPS). Alternatively, the material constituting the active layer of the thin film transistor may include an oxide semiconductor material, for example, at least one of IGZO (indium gallium zinc oxide), ITZO (indium tin zinc oxide), ITWO (indium tungsten zinc oxide), ZnO (zinc oxide), CdO (cadmium oxide) or $Al_2O_3$ (aluminum oxide).

Taking the material of the active layer of the thin film transistor being ITZO or ITWO as an example, the influence of the preparation process of the active layer on the carrier mobility of the thin film transistor is explained. Specifically, after the ITZO or ITWO solution is prepared, the solution is treated by an annealing process and a UV irradiation process. For example, the annealing process is performed at 250° C.–500° C., the relationship between the temperature of the annealing process and the UV irradiation process and the carrier mobility of the thin film transistor is shown in table 1.

TABLE 1

| temperature of annealing process | mobility ($cm^2/Vs$) | | subthreshold swing (V/dec) | | threshold voltage (V) | |
| --- | --- | --- | --- | --- | --- | --- |
| | Non-UV | UV | Non-UV | UV | Non-UV | UV |
| 250 | 0.0082 | 0.491 | 1.10 | 0.45 | 2.22 | 1.67 |
| 300 | 1.20 | 5.36 | 0.39 | 0.16 | 1.88 | 1.60 |
| 400 | 4.66 | 25.80 | 0.16 | 0.25 | 2.66 | 1.62 |
| 500 | 9.96 | 32.31 | 0.16 | 0.12 | 2.01 | 1.98 |

It can be seen from table 1 that the higher the annealing temperature, the higher the carrier mobility of the thin film transistor. Based on this, the carrier mobility can be significantly increased after UV irradiation. In addition, the threshold voltage (Vth) of the thin film transistor is also reduced after UV irradiation. However, the regularity of the influence of the annealing process and the UV irradiation process on the subthreshold swing (SS) of the thin film transistor has not been found yet.

Further, in order to realize transparent display, in certain exemplary embodiments, the substrate 01 may be made of a transparent resin material, and the resin material may be a flexible material or a hard material; or the substrate 01 may be a glass substrate.

Figure 3C:
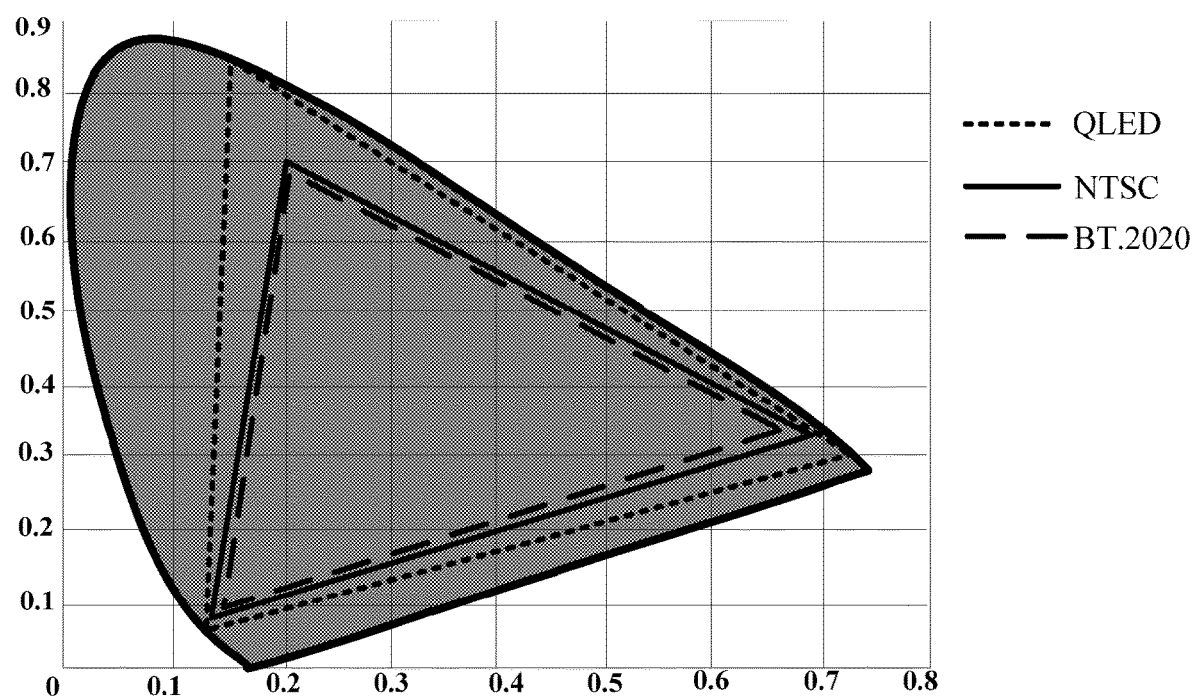
FIG. 3c is a schematic diagram of the color gamut of the light emitting diode in FIG. 1.

In summary, the display panel provided by the embodiment of the present disclosure includes a light emitting diode, which may be a quantum dot light emitting diode. In the process of photoluminescence, the half-width of light emitted by quantum dot materials in quantum dot light emitting diode is about 30 nm. Therefore, the quantum dot light emitting diode has a near-Gaussian symmetrical narrow-band emission characteristic, so that the purity of the excited color is high, and the display panel obtains a high color gamut, as shown in FIG. 3c, which can reach 100% NTSC or more, thereby making the color displayed on the display panel more realistic.

Based on the structure of the light emitting diode 30, the specific structure of the display panel will be described in detail below.

For example, the pixel circuit 102 includes a thin film transistor, and a first electrode 301 of the light emitting diode 30 can be connected to a drain of the thin film transistor, thereby electrically connecting the light emitting diode 30 to the pixel circuit 102.

Figure 4:
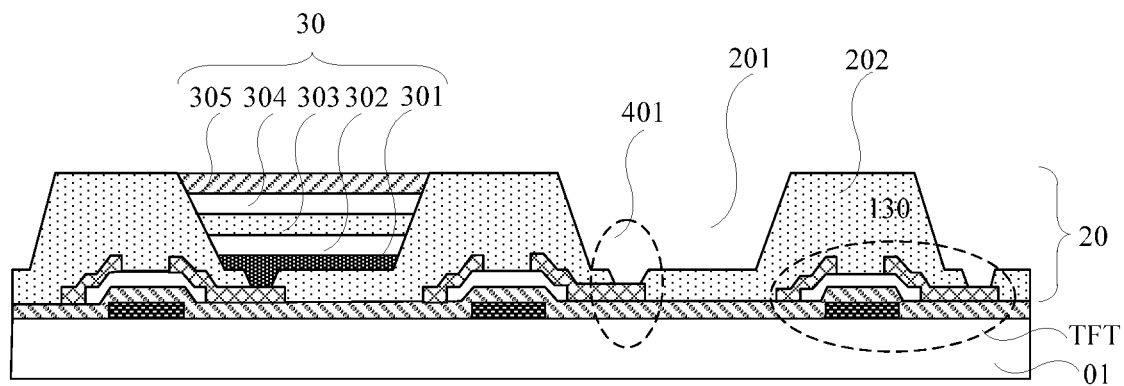
FIG. 4 is a structural schematic diagram of a pixel defining layer in a display panel according to an embodiment of the present disclosure.
Figure 5:
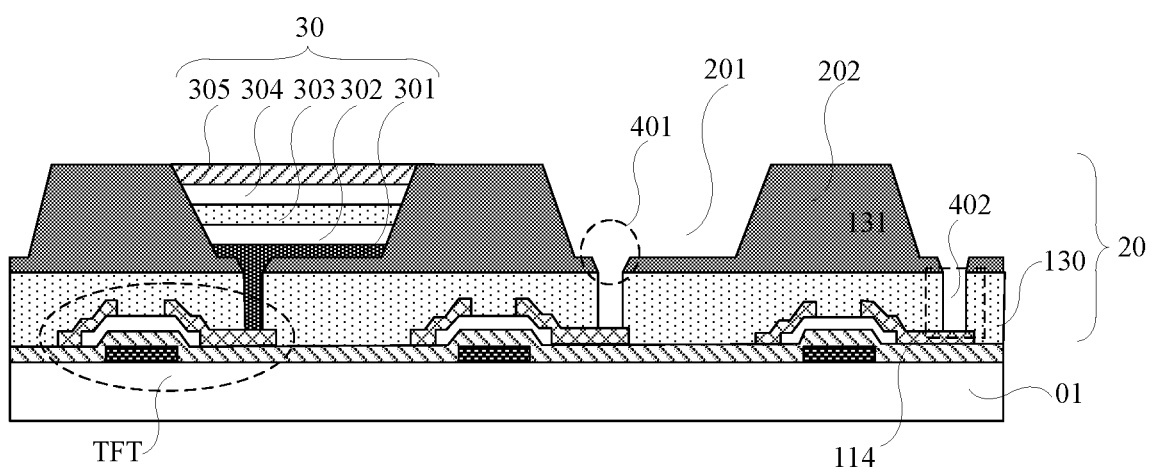
FIG. 5 is another structural schematic diagram of a pixel defining layer in a display panel according to an embodiment of the present disclosure.
Figure 6:
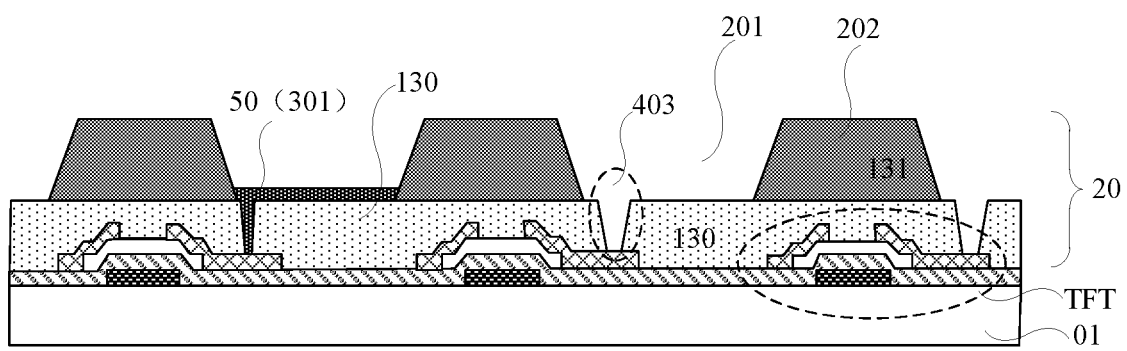
FIG. 6 is yet another structural schematic diagram of a pixel defining layer in a display panel according to an embodiment of the present disclosure.

Specifically, as shown in FIG. 4-6, a first via hole 401 is disposed at a position of a bottom of the groove 201 corresponding to the drain of the thin film transistor, and the first electrode 301 of the light emitting diode is electrically connected to the drain of the thin film transistor through the first via hole 401.

In this case, the manner in which the pixel defining layer 20 is disposed may be as follows.

For example, as shown in FIG. 4, the pixel defining layer 20 is composed of a passivation layer 130 covering the pixel circuit 102; the depth of the groove 201 is less than the thickness of the passivation layer 130. In this embodiment, the cofferdam 202 is formed of the passivation layer 130.

Alternatively, for example, as shown in FIG. 5, the pixel defining layer 20 is composed of a passivation layer 130 covering the pixel circuit 102 and a photoresist layer disposed on a surface of the passivation layer 130 facing away from the pixel circuit 102; the depth of the groove 201 is less than the thickness of the photoresist layer 131. In this embodiment, the cofferdam 202 is formed of the photoresist layer 131.

As can be seen from the above, the passivation layer 130 in FIG. 4 functions as the pixel defining layer 20. In FIG. 5, the passivation layer 130 and the photoresist layer 131 function as the pixel defining layer 20, so that the step of separately forming the pixel defining layer 20 can be omitted, so as to simplify the fabricating process of the display panel.

Specifically, as shown in FIG. 6, the pixel defining layer 20 is composed of a passivation layer 130 covering the pixel circuit 102 and a photoresist layer 131 disposed on a surface of the passivation layer 130 facing away from the pixel circuit 102; the depth of the groove 201 is equal to the thickness of the photoresist layer 131. In this embodiment, the cofferdam 202 is formed of the photoresist layer 131.

Further, the bottom of the groove 201 may be provided with a pixel electrode 50. That is, the pixel electrode 50 functions as the first electrode 301 of the light emitting diode 30.

Figure 7A:
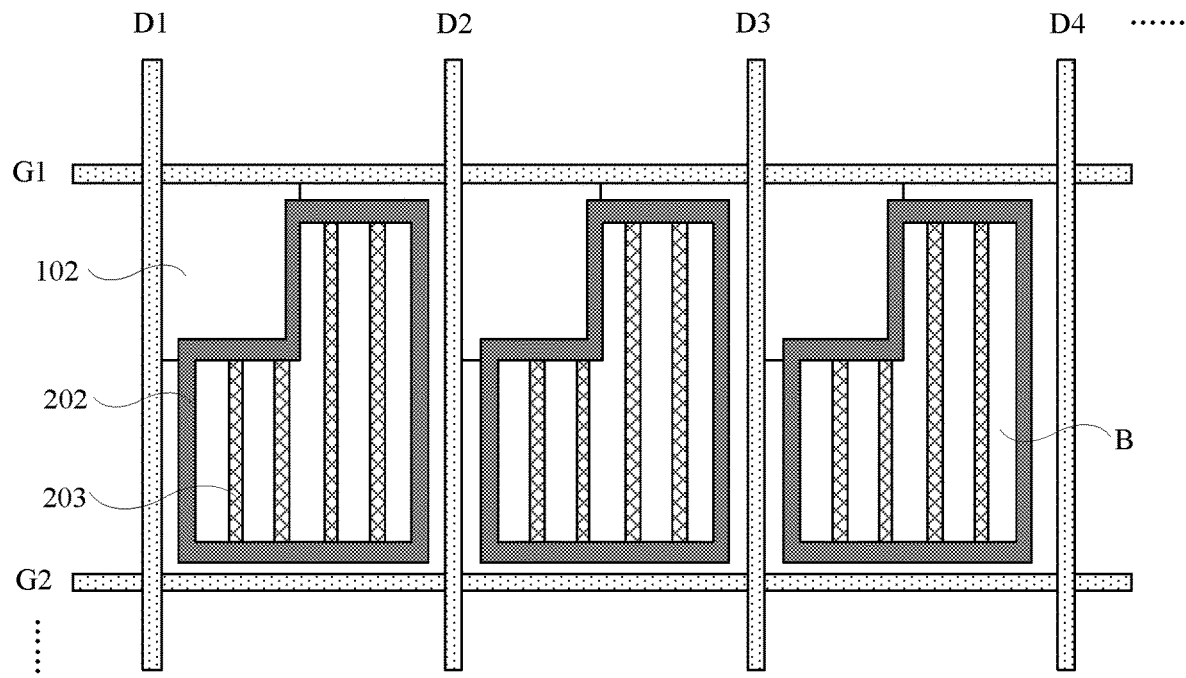
FIG. 7a is a structural schematic diagram of a wall disposed in the groove of FIG. 1.
Figure 7B:
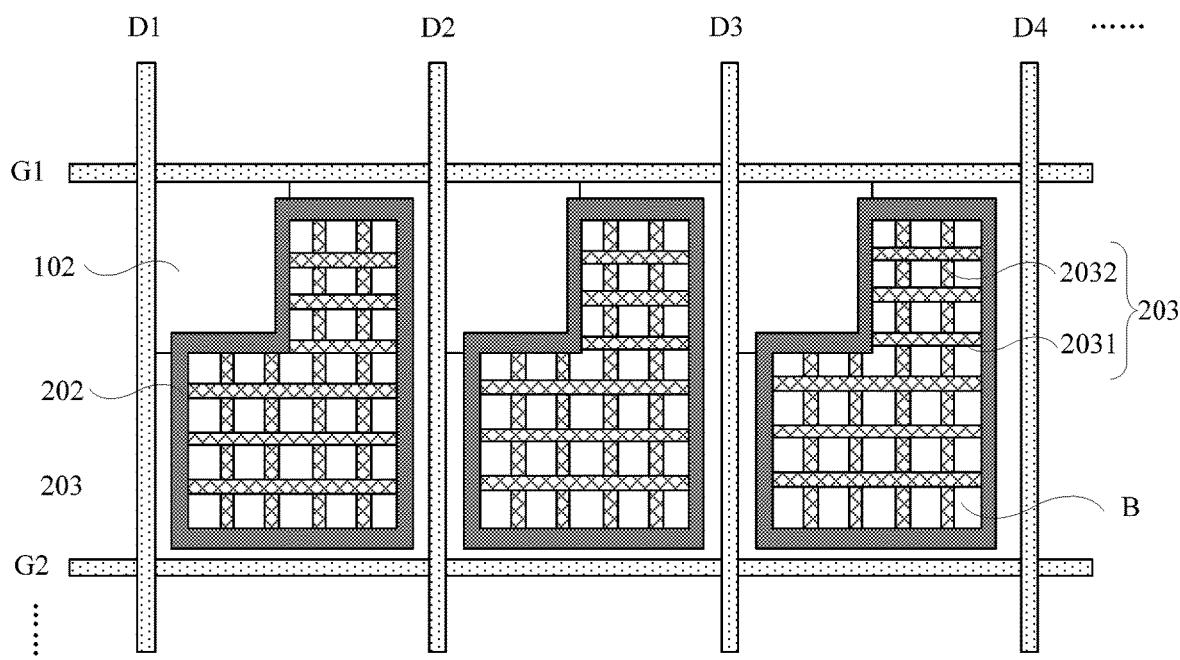
FIG. 7b is another structural schematic diagram of a wall disposed in the groove of FIG. 1.

Based on this, in order to make the film layer distribution in the groove 201 uniform, in certain exemplary embodiments, as shown in FIG. 7a or 7b, a plurality of walls 203 crossing the groove 201 are disposed separately in the groove 201. The area where the groove 201 is located can be subdivided into a plurality of enclosed areas B surrounded by the wall 203 by the wall 203 and the cofferdam 202. In this case, when a light emitting layer 303 is formed in the groove 201 by a process such as vapor deposition or inkjet printing, the walls 203 can prevent the film material in the enclosed areas B from further diffusing, thereby mitigating the problem that the light emitting layer 303 is uneven due to the diffusion.

Based on this, the wall 203 can be arranged in the manner as shown in FIG. 7a, the extending directions of any two walls 203 are the same, and the distance between two directly adjacent walls 203 is fixed. In this way, the uniformity of the film layers in any two adjacent enclosed areas B can be made equal or approximately equal.

Alternatively, as shown in FIG. 7b, the plurality of walls 203 include first sub-walls 2031 and second sub-walls 2032 respectively extend horizontally and vertically. The first sub-walls 2031 and the second sub-walls 2032 intersect to define a plurality of enclosed areas B arranged in a matrix. Two directly adjacent enclosed areas are equal in area. In this way, the uniformity of the film layers in any two adjacent enclosed areas B can be made equal or approximately equal.

In addition, in order to simplify the fabricating process, in certain exemplary embodiments, the walls are in the same layer as the pixel defining layer, and the walls are of the same material as the pixel defining layer. In this case, the walls 203 may be integrated with the pixel defining layer 20.

An embodiment of the present disclosure provides a display device including the display panel according to any of the above embodiments. The display device has the same advantages as the display panel provided in the above embodiment, which will not be described herein again.

It should be noted that the display device may be any product or component having a display function such as a display, a television, a digital photo frame, a mobile phone or a tablet computer.

An embodiment of the present disclosure provides a method of fabricating a display panel, the method includes: forming a plurality of pixels on a substrate by a composition process, each pixel including a pixel circuit disposed on the substrate; forming a pixel defining layer covering the pixel circuit; a surface of the pixel defining layer facing away from the pixel circuit being provided with a plurality of grooves; the plurality of grooves being in one-to-one correspondence with the plurality of pixels; and forming a light emitting diode electrically connected to the pixel circuit in the groove.

Specifically, forming a pixel circuit including, for example, a thin film transistor may include the following steps.

Figure 8A:
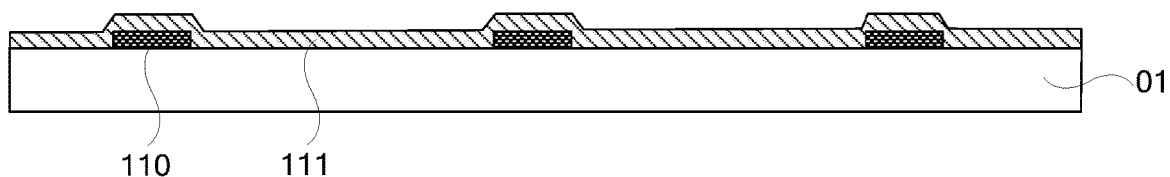

First, a metal layer is formed on the substrate 01 by a magnetron sputtering process. For example, the metal layer is made of copper. Then, the gate 110 and the gate lines (G1, G2, . . . ) as shown in FIG. 8a are formed by exposure, development, and etching processes.

Next, on the substrate 01 on which the gate electrode 110 is formed, a gate insulating layer 111 is formed by a PECVD (plasma enhanced chemical vapor deposition) process. The material constituting the gate insulating layer 111 is silicon nitride (SiN).

Next, a method of fabricating an active layer of a thin film transistor will be described by taking an active layer made of a semiconductor transparent conductive material as an example.

Figure 8B:
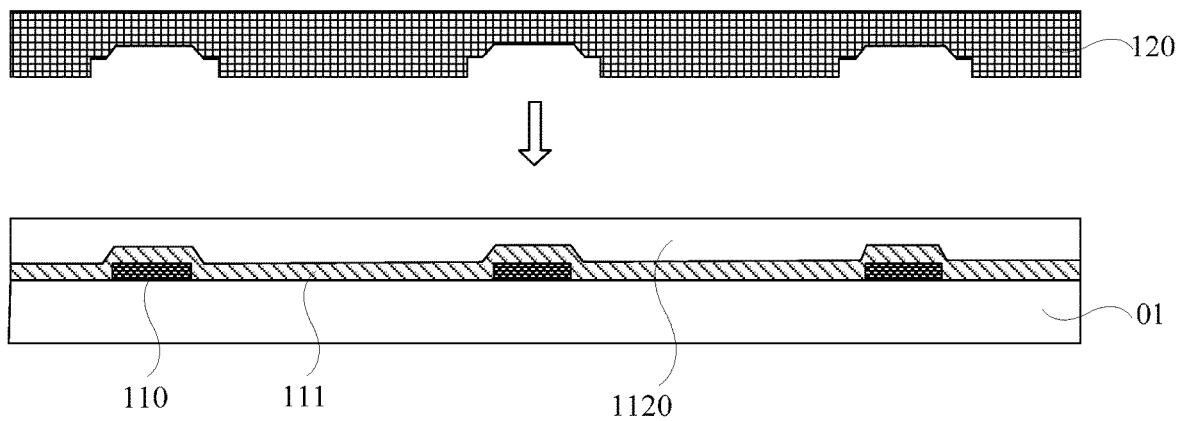

Specifically, as shown in FIG. 8b, an organic solution is applied on the surface of the gate insulating layer 111 to form an organic thin film 1120. The solute of the organic solution may include ITZO (indium tin zinc oxide) or ITWO (indium tungsten zinc oxide); the viscosity of the organic solution is 2~4 cp.

Figure 8C:
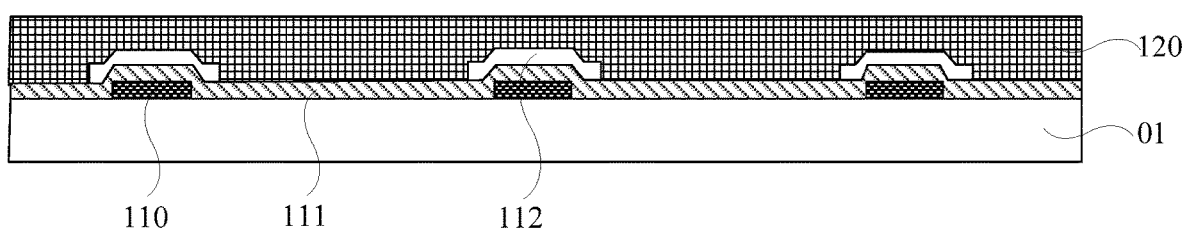

Then, when the organic thin film 1120 is in a semi-cured state, as shown in FIG. 8c, the organic thin film 1120 is pressed by a mold 120.

Figure 8D:
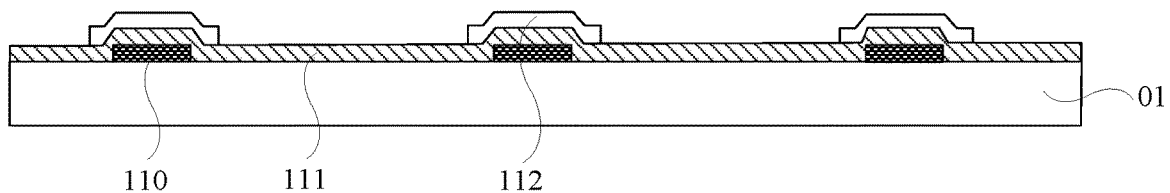

Next, a pre-bake process is performed to the organic film 1120 for 1~2 hours by annealing and UV irradiation at 200~300° C. Then, a hard-bake process is performed to the organic film 1120 for 1 hour at 350° C. to form an active layer 112 as shown in FIG. 8d, and the thickness of the active layer 112 is about 5 nm. In this way, drying at 200~400° C. can completely decompose the organic solution, so that the organic contaminants in the organic film 1120 can be completely removed to improve the purity of the active layer 112. Specifically, the relationship between the temperature of the annealing process and the UV irradiation process and the carrier mobility of the thin film transistor is shown in table 1, which will not be described herein again.

Next, on the substrate 01 on which the active layer 112 is formed, a metal layer is formed by a magnetron sputtering process, and then a source 113 and a drain 114 of the thin film transistor as shown in FIG. 8e is formed by exposure, development, and etching processes.

In addition, as shown in FIG. 9, after the pixel circuit including the thin film transistor is fabricated, the method for fabricating the display panel further includes the following steps.

S101: as shown in FIG. 1, forming a pixel defining layer 20 covering the pixel circuit 102.

A surface of the pixel defining layer 20 facing away from the pixel circuit 102 is provided with a plurality of grooves 201. A cofferdam 202 is disposed around each of the grooves 201. The plurality of grooves 201 are in one-to-one correspondence with the plurality of pixels 101.

S102, forming a light emitting diode 30 electrically connected to the pixel circuit 102 in the groove 201.

The fabricating method of the display panel has the same technical effects as the display panel provided in the above embodiment, which will not be described herein again.

Hereinafter, the steps of forming the pixel defining layer 20 covering the pixel circuit 102 will be described in detail by way of example.

For example, in sub-step 1, on the substrate 01 on which the pixel circuit 102 is formed, the passivation layer 130 and the photoresist layer 131 as shown in FIG. 10a are sequentially formed. The material constituting the passivation layer 130 is PMMA (polymethyl methacrylate), and the dielectric constant E of the PMMA is 3.2~3.5.

Figure 10B:
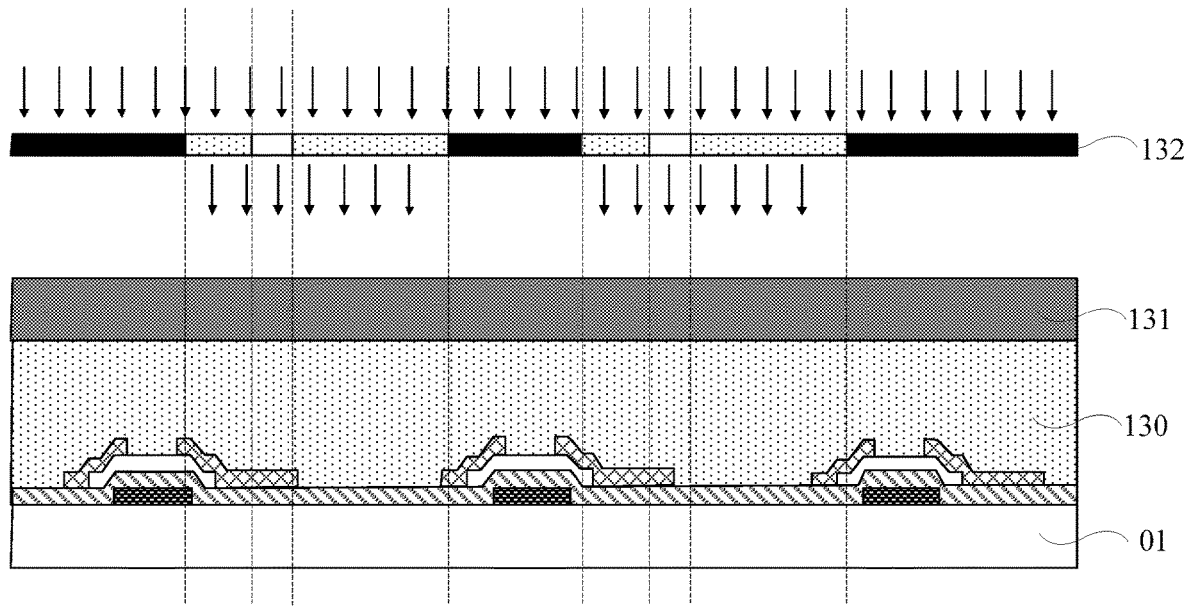
Figure 10C:
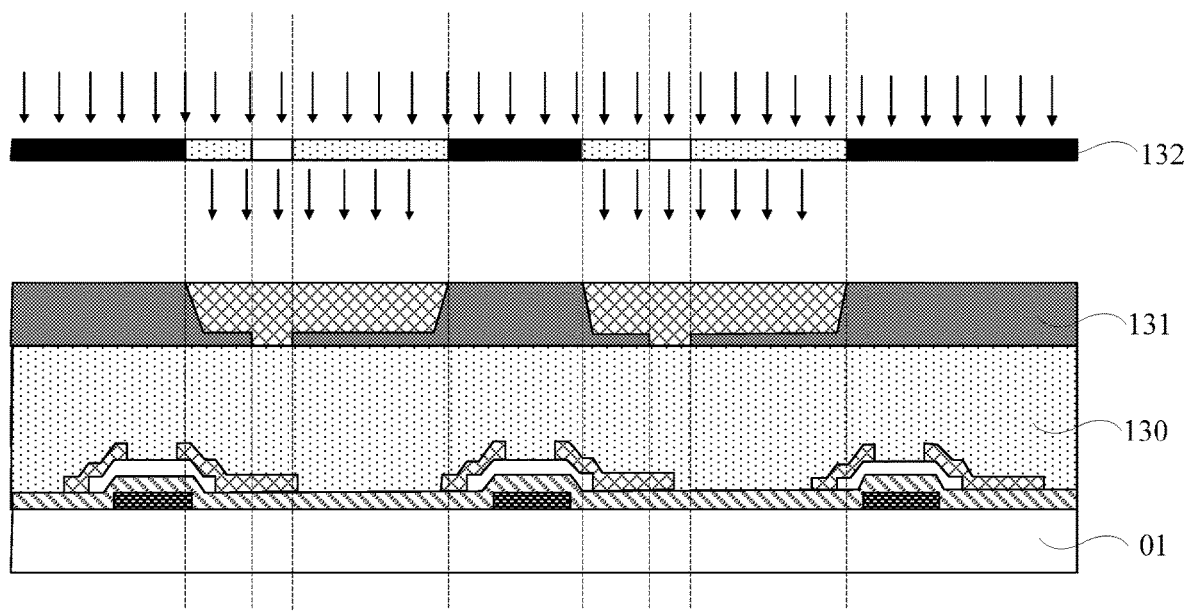

In sub-step 2, mask exposure is performed on the photoresist layer 131 by using a gray-tone mask 132 as shown in FIG. 10b. The gray-tone mask 132 includes a completely transmissive region, a completely light-shielding region, and a semi-transmissive region. For example, in the case where the photoresist layer 131 is a positive photoresist, as shown in FIG. 10c, the photoresist layer 131 in the completely transmissive region can be completely dissolved in the developing solution; the photoresist layer 131 in the semi-transmissive region can be partially dissolved in the developing solution; the photoresist layer 131 in the completely light-shielding region is not dissolved in the developing solution.

Figure 10D:
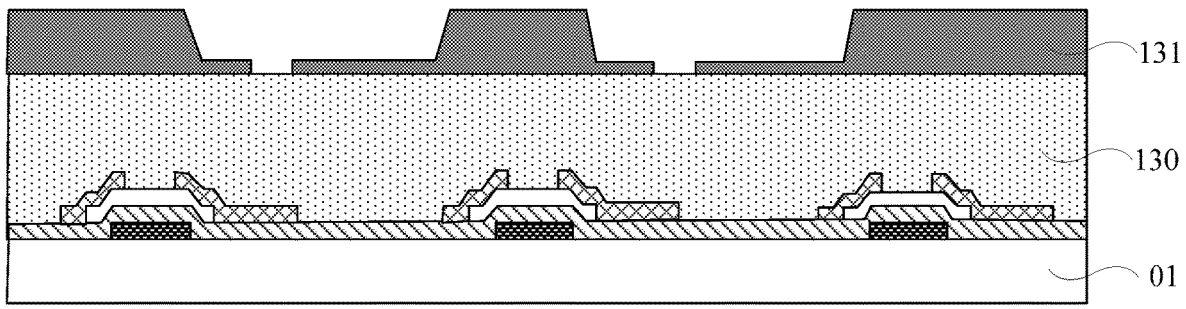

In sub-step 3, the photoresist layer 131 is developed to form a structure as shown in FIG. 10d.

Figure 10E:
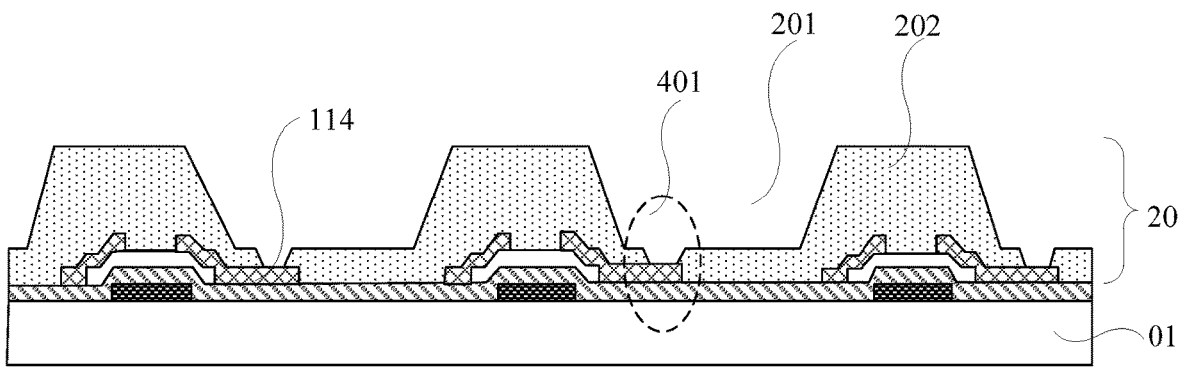

In sub-step 4, in the position where the photoresist is completely developed, the material constituting the passivation layer 130 is completely removed by an etching process to form a first via hole 401 as shown in FIG. 10e. Then, the photoresist corresponding to the semi-transmissive region is removed by an ashing process, and the groove 201 is formed by an etching process. The first via hole 401 is located at the bottom of the groove 201, and the first via hole 401 corresponds to the drain 114 of the thin film transistor for driving the QLED in the pixel circuit.

As can be seen from the above, the groove 201 and the first via hole 401 at the bottom of the groove 201 are formed on the passivation layer 130. Therefore, the passivation layer 130 can be shared as the pixel defining layer 20, so that the pixel defining layer 20 need not be separately fabricated. Thus, the cost of the fabricating process can be reduced.

In this case, the method of forming the light emitting diode 30 includes: forming a first electrode 301 as shown in FIG. 4 in the groove 201, the first electrode 301 being electrically connected to the drain 301 of the thin film transistor through the first via hole 401.

Specifically, taking the light emitting diode 30 being the bottom-emitting type as an example, an ITO or IZO thin film can be formed in the groove by a magnetron sputtering process as the first electrode 301.

The fabricating method of the light emitting diode 30 further includes forming a hole transport layer 302 at a position corresponding to the groove 201 by a composition process on a side of the first electrode 301 facing away from the substrate 01.

Specifically, a metal layer is formed on the surface of the first electrode 301 by a magnetron sputtering process, and the metal layer can be made of a material such as $MoO_3$, NiO, CBP, TCTA, etc. Then, the metal layer is patterned by exposure, development, and etching processes to form a hole transport layer 302.

Then, on the substrate 01 on which the hole transport layer 302 is formed, the light emitting layer 303 is formed at a position corresponding to the groove 201 by an inkjet printing process or an evaporation process. The materials constituting the light emitting layer 303 are the same as those described above, which will not be described herein again.

Figure 12A:
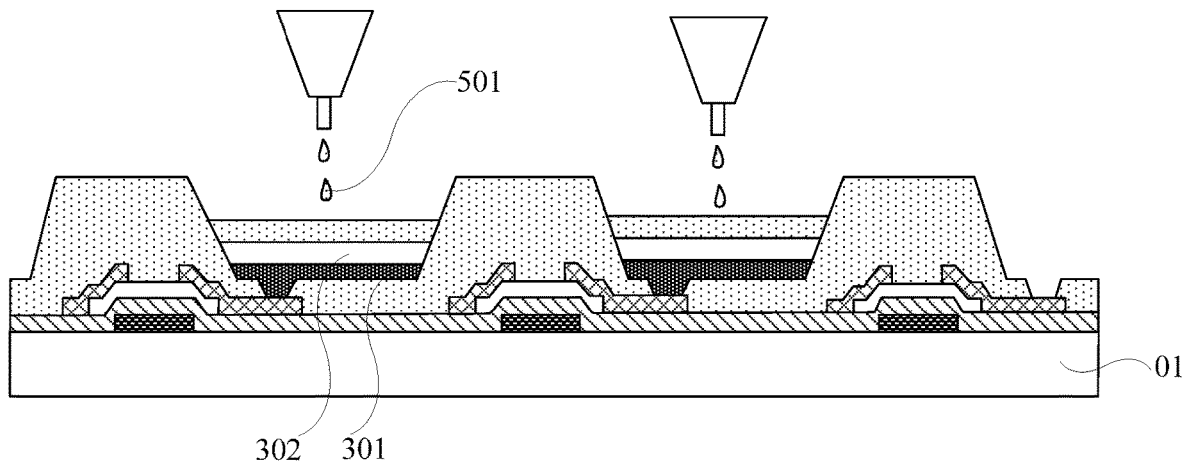
FIGS. 12a, 12b, and 12c are schematic diagrams of an implementation of preparing a quantum dot light emitting layer.
Figure 12B:
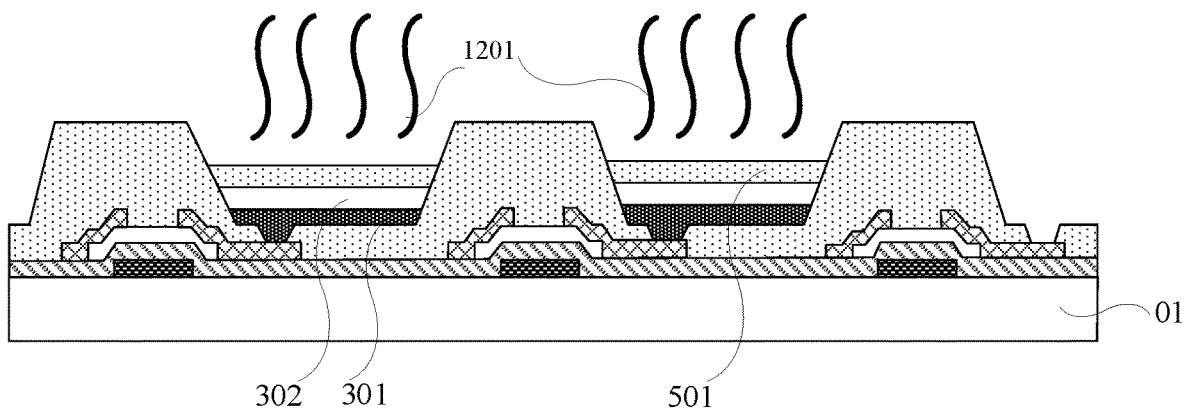
Figure 12C:
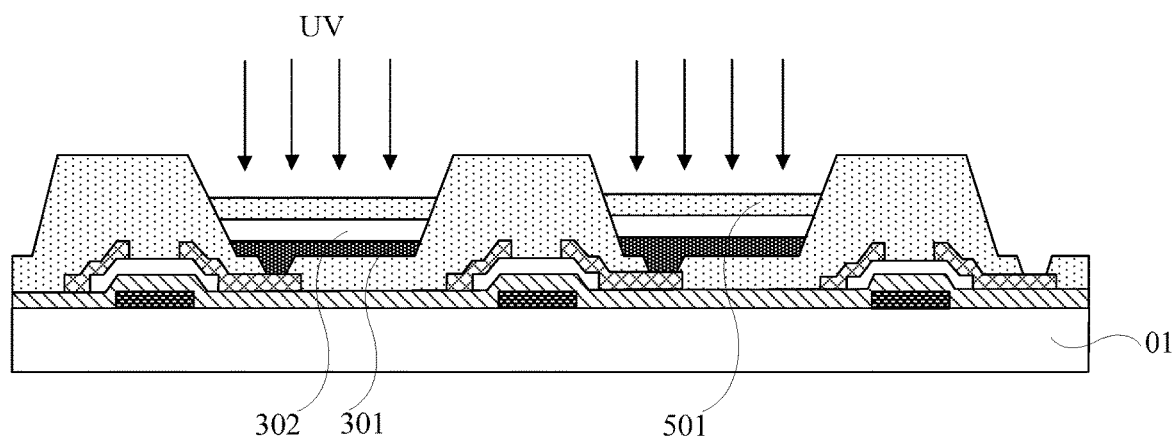

The fabricating process of the light emitting layer 303 will be described by taking the inkjet printing process as an example. Specifically, as shown in FIG. 12a, a quantum dot solution 501 composed of a nano quantum dot compound is dropped onto the surface of the hole transport layer 302 in the groove 201 by inkjet printing. Next, as shown in FIG. 12b, a pre-bake process 1201 is performed to the quantum dot solution 501. Finally, as shown in FIG. 12c, the quantum dot solution 501 is subjected to UV irradiation treatment to form the light emitting layer 303. After the pre-bake process and UV irradiation treatment, the organic contaminants in the quantum dot solution 501 can be removed, and the light emitting efficiency of the light emitting layer 303 can be improved.

Next, on the substrate 01 on which the light emitting layer 303 is formed, the electron transport layer 304 is formed at a position corresponding to the groove 201 by a composition process. The material constituting the electron transport layer 304 includes ZnO, $TiO_2$, $WO_3$, $SnO_2$, etc. The fabrication process of the electron transport layer 304 is the same as the fabrication process of the hole transport layer 302, which will not be described herein again.

Finally, on the substrate 01 on which the electron transport layer 304 is formed, the second electrode 305 of the light emitting diode 30 is formed. Taking the light emitting diode 30 being the bottom-emitting type as an example, the material constituting the second electrode 305 may be aluminum.

It should be noted that the second electrodes 305 of all the light emitting diodes 30 may be connected to each other. In this case, the fabrication of the second electrode 305 can be completed by forming a metal layer on the substrate 01 on which the electron transport layer 304 is formed by a magnetron sputtering process.

Alternatively, when the second electrode 305 is located in the groove 201, as shown in FIG. 4, on the substrate 01 on which the electron transport layer 304 is formed, a metal layer may be formed by a magnetron sputtering process; then the metal layer is composited by a mask, an exposure, and a development process to form the second electrode 305.

Alternatively, for example, forming the pixel defining layer 20 may include the following sub-steps.

Sub-step 1, on the substrate 01 on which the thin film transistor is formed, as shown in FIG. 10a, a passivation layer 130 and a photoresist layer 131 are sequentially formed.

Figure 11A:
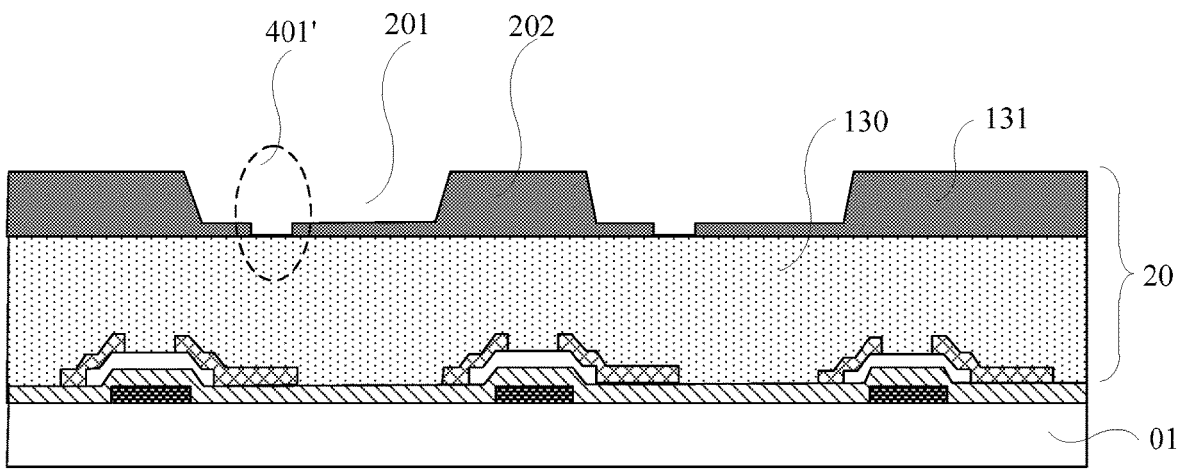
FIGS. 11a and 11b are schematic diagrams of another implementation of step S101 in FIG. 9.

Sub-step 2, as shown in FIG. 10b, a groove 201 as shown in FIG. 11a is formed on the photoresist layer 131 by a composition process using a gray-tone mask 132, and a via hole 401' is formed at a position corresponding to the drain 114 of the thin film transistor diode electrically connected to the light emitting diode at the bottom of the groove 201.

Figure 11B:
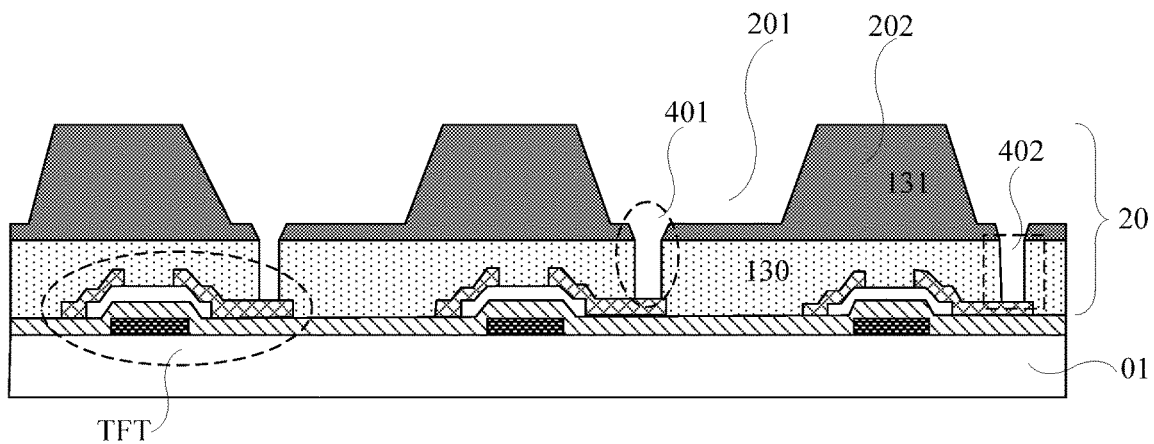

Sub-step 3, as shown in FIG. 11b, a first via hole 401 penetrating the photoresist layer 131 and the passivation layer 130 is formed at the bottom of the groove 201 by a composition process.

It should be noted that, in the present disclosure, the composition process may include a photolithography process, or include a photolithography process and an etching step, and may also include other processes of forming a predetermined pattern, such as printing, inkjet, etc.; the photolithography process refers to a process of forming a pattern by using a photoresist, a mask, an exposure machine, or the like, including procedures of film formation, exposure, and development. The corresponding composition process can be selected in accordance with the structure formed in the present disclosure.

A one-time composition process in the embodiment of the present disclosure may be to form different exposure regions by one mask exposure process, and then perform a removal process such as multiple etching, ashing, etc. on different exposure regions to finally obtain a desired pattern.

Based on this, the method for forming the first electrode of the light emitting diode 30 includes: forming a first electrode 301 in the groove 201, the first electrode 301 being electrically connected to the drain of the thin film transistor through the first via hole 401.

In addition, the method for fabricating other film layers in the light emitting diode 30 is the same as described above, which will not be described herein.

Alternatively, for example, forming the pixel defining layer 20 may include the following sub-steps.

Figure 13A:
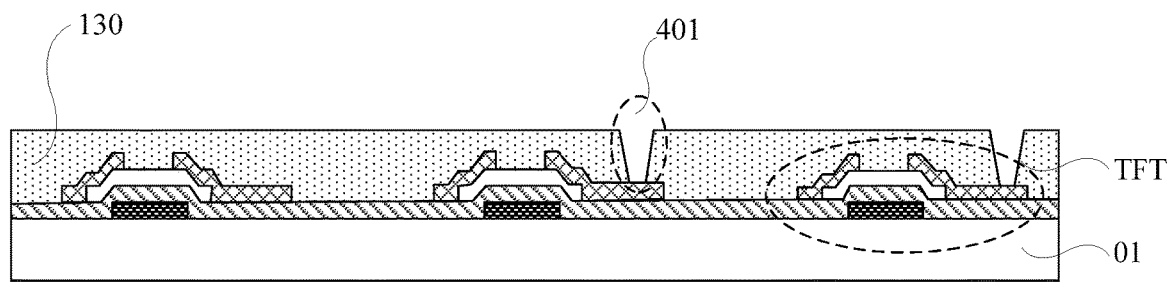
FIGS. 13a, 13b, and 13c are schematic diagrams of still another implementation of step S101 in FIG. 9.

Sub-step 1, as shown in FIG. 13a, a passivation layer 130 is formed on the substrate 01 on which the pixel circuit is formed, and a first via hole 401 is formed on the passivation layer 130 by a composition process.

Figure 13B:
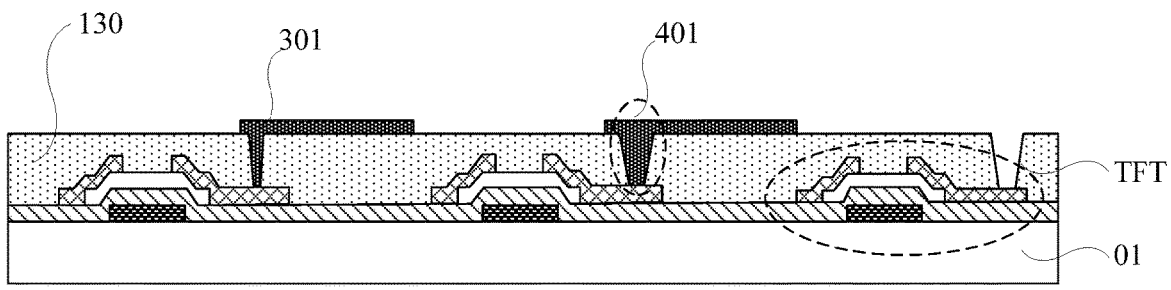

Sub-step 2, as shown in FIG. 13b, on the substrate 01 on which the above structure is formed, a transparent conductive layer is formed, and the first electrode 301 is formed by a composition process. The first electrode 301 is electrically connected to the drain of the thin film transistor through the first via hole 401.

Figure 13C:
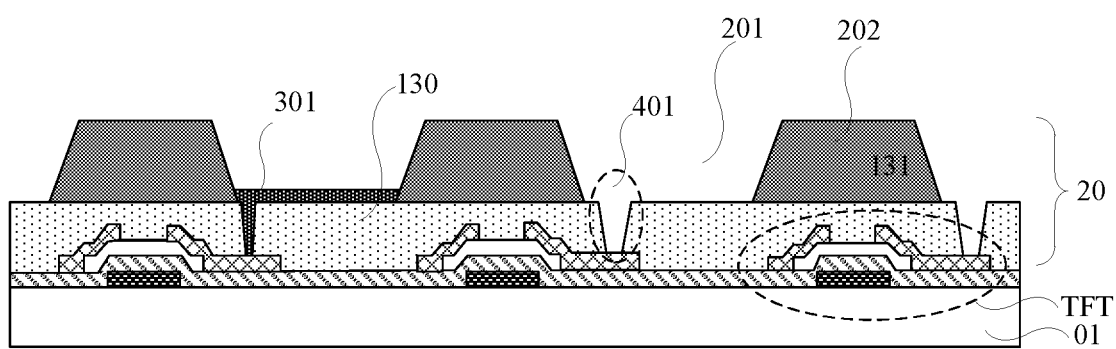

Sub-step 3, as shown in FIG. 13c, on the substrate 01 on which the above structure is formed, an insulating material layer (for example, a photoresist layer 131) is formed, and the grooves 202 as shown in FIG. 6 are formed on the insulating material layer by a composition process.

In summary, the display panel provided by the embodiment of the present disclosure includes a light emitting diode, which may be a quantum dot light emitting diode. In the process of photoluminescence, the half-width at half maximum of light emitted by quantum dot materials in quantum dot light emitting diode is about 30 nm. Therefore, the quantum dot light emitting diode almost has a Gaussian symmetrical narrow-band emission characteristic, so that the purity of the excited color is high, and the display panel has a high color gamut, which can reach 100% NTSC or more, thereby making the color displayed on the display panel more realistic.

The above embodiments are only used for explanations rather than limitations to the present disclosure, the ordinary skilled person in the related technical field, in the case of not departing from the spirit and scope of the present disclosure, may also make various modifications and variations, therefore, all the equivalent solutions also belong to the scope of the present disclosure, the patent protection scope of the present disclosure should be defined by the claims.

What is claimed is:

1. A display panel, comprising: a substrate and a plurality of pixels disposed on the substrate;
wherein each pixel comprises a pixel circuit disposed on the substrate; the display panel further comprises a pixel defining layer covering the pixel circuit; a surface of the pixel defining layer facing away from the pixel circuit is provided with a plurality of grooves; the plurality of grooves are in one-to-one correspondence with the plurality of pixels;
wherein each of the grooves is provided with a light emitting diode electrically connected to the pixel circuit;
wherein a plurality of walls crossing at least one of the grooves are disposed separately in the at least one of the grooves; the walls are in the same layer as the pixel defining layer, and the walls are of the same material as the pixel defining layer; and
wherein the plurality of walls comprise a plurality of first sub-walls and a plurality of second sub-walls respectively extend horizontally and vertically; the first sub-walls and the second sub-walls intersect to define a plurality of enclosed areas arranged in a matrix; two directly adjacent enclosed areas are equal in area.

2. The display panel according to claim 1, wherein an orthographic projection of each groove on the substrate overlaps with a light emitting area in a corresponding pixel.

3. The display panel according to claim 1, wherein the pixel defining layer is composed of a passivation layer covering the pixel circuit; a depth of at least one of the grooves is less than a thickness of the passivation layer.

4. The display panel according to claim 1, wherein the pixel defining layer is composed of a passivation layer covering the pixel circuit and a photoresist layer disposed on a surface of the passivation layer facing away from the pixel circuit; a depth of at least one of the grooves is less than or equal to a thickness of the photoresist layer.

5. The display panel according to claim 1, wherein the pixel circuit comprises a thin film transistor, the light emitting diode is electrically connected to a drain of the thin film transistor.

6. The display panel according to claim 5, wherein a first via hole is disposed at a position of a bottom of at least one of the grooves corresponding to the drain of the thin film transistor, and a first electrode of the light emitting diode is electrically connected to the drain of the thin film transistor through the first via hole.

7. The display panel according to claim 5, wherein a material constituting an active layer of the thin film transistor comprises at least one of an oxide semiconductor material and a low temperature polysilicon.

8. The display panel according to claim 1, wherein any two of the walls extend in the same direction, and a distance between two directly adjacent walls is fixed.

9. The display panel according to claim 1, wherein the light emitting diode comprises: a hole transport layer, a light emitting layer, an electron transport layer and a second electrode which are sequentially located on a side of the first electrode facing away from the pixel circuit;

wherein the first electrode is made of a transparent conductive material, the second electrode is made of the metal material; alternatively, the first electrode is made of a metal material, and the second electrode is made of the transparent conductive material.

10. The display panel according to claim 9, wherein the light emitting diode is a quantum dot light emitting diode, and a material of the light emitting layer comprises at least any one of CdSe, CdS, CdTe, ZnSe, ZnTe, ZnS, HgTe, InAs, InP, and GaAs.

11. A display device, comprising the display panel of claim 1.

12. The display device according to claim 11, wherein an orthographic projection of each groove on the substrate overlaps with a light emitting area in a corresponding pixel.

13. The display device according to claim 11, wherein the pixel defining layer is composed of a passivation layer covering the pixel circuit; a depth of at least one of the grooves is less than a thickness of the passivation layer.

14. A display panel, comprising: a substrate and a plurality of pixels disposed on the substrate;

wherein each pixel comprises a pixel circuit disposed on the substrate; the display panel further comprises a pixel defining layer covering the pixel circuit; a surface of the pixel defining layer facing away from the pixel circuit is provided with a plurality of grooves; the plurality of grooves are in one-to-one correspondence with the plurality of pixels;

wherein each of the grooves is provided with a light emitting diode electrically connected to the pixel circuit;

wherein the light emitting diode comprises: a hole transport layer, a light emitting layer, an electron transport layer and a second electrode which are sequentially located on a side of the first electrode facing away from the pixel circuit;

wherein the first electrode is made of a transparent conductive material, the second electrode is made of the metal material; alternatively, the first electrode is made of a metal material, and the second electrode is made of the transparent conductive material; and wherein the light emitting diode is a quantum dot light emitting diode, and a material of the light emitting layer comprises at least any one of CdSe, CdS, CdTe, ZnSe, ZnTe, ZnS, HgTe, InAs, InP, and GaAs.

* * * * *